(12) United States Patent
Kim

(10) Patent No.: US 12,362,034 B2
(45) Date of Patent: Jul. 15, 2025

(54) SEMICONDUCTOR DEVICE RELATED TO A PARALLEL TEST

(71) Applicant: SK hynix Inc., Icheon-si (KR)

(72) Inventor: Hyun Seung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 83 days.

(21) Appl. No.: 18/453,903

(22) Filed: Aug. 22, 2023

(65) Prior Publication Data

US 2024/0395353 A1    Nov. 28, 2024

(30) Foreign Application Priority Data

May 23, 2023   (KR) .................. 10-2023-0066484

(51) Int. Cl.
*G11C 29/54*   (2006.01)
(52) U.S. Cl.
CPC .................................... *G11C 29/54* (2013.01)
(58) Field of Classification Search
CPC ........................... G11C 29/54; G11C 29/1201
See application file for complete search history.

(56) References Cited

U.S. PATENT DOCUMENTS

| 6,065,143 A | * | 5/2000 | Yamasaki | G11C 29/30 365/201 |
| 2003/0149925 A1 | | 8/2003 | Angelotti et al. | |
| 2004/0240302 A1 | * | 12/2004 | Park | G11C 7/1042 365/189.08 |
| 2018/0226108 A1 | * | 8/2018 | Kwon | G11C 7/222 |

FOREIGN PATENT DOCUMENTS

KR          102077072 B1    2/2020

* cited by examiner

*Primary Examiner* — Mohammed A Bashar
(74) *Attorney, Agent, or Firm* — WILLIAM PARK & ASSOCIATES LTD.

(57) ABSTRACT

According to an embodiment of the present disclosure, a semiconductor device includes an even data input circuit configured to store, in an even core cell, data that is input through an even data pad and that has a first pattern in response to an even data input strobe signal in a write operation of a parallel test. The semiconductor device includes an odd data input circuit configured to store, in an odd core cell, data that is input through the even data pad and that has a second pattern in response to an odd data input strobe signal in the write operation of the parallel test.

20 Claims, 14 Drawing Sheets

FIG.8

| RDRD_E | RDRD_O | COM_CD |
|--------|--------|--------|
| L | L | L |
| L | H | H |
| H | L | H |
| H | H | L |

SEMICONDUCTOR DEVICE RELATED TO A PARALLEL TEST

CROSS-REFERENCE TO RELATED APPLICATION

The present application claims priority under 35 U.S.C. § 119(a) to Korean Patent Application No. 10-2023-0066484, filed in the Korean Intellectual Property Office on May 23, 2023, the entire disclosure of which is incorporated herein by reference.

BACKGROUND

1. Technical Field

Various embodiments of the present disclosure generally relate to a semiconductor device, and more particularly, to a semiconductor device related to a parallel test.

2. Related Art

In general, a semiconductor device performs various tests in order to determine a fail. A parallel test, among the tests that are performed by the semiconductor device, is performed in a way that a read operation of confirming whether data stored in core cells have the same pattern as a preset pattern of data that has been stored in the core cells is sequentially performed after a write operation of storing the data having the preset pattern.

SUMMARY

In an embodiment, a semiconductor device may include an even data input circuit configured to store, in an even core cell, data that is input through an even data pad and that has a first pattern in response to an even data input strobe signal in a write operation of a parallel test, and an odd data input circuit configured to store, in an odd core cell, data that is input through the even data pad and that has a second pattern in response to an odd data input strobe signal in the write operation of the parallel test.

In an embodiment, a semiconductor device may include an even data input circuit configured to store, in an even core cell, data that is input through an even data pad and that has a first pattern in response to an even data input strobe signal in a write operation of a parallel test, an odd data input circuit configured to store, in an odd core cell, data that is input through an even data pad and that has a second pattern in response to an odd data input strobe signal in the write operation of the parallel test, and a comparison code generation circuit configured to generate a comparison code by comparing even read driving data that is generated by repeating even read core data that is output by the even core cell in response to a read strobe signal and odd read driving data that is generated by repeating odd read core data that is output by the odd core cell in response to the read strobe signal, when a read operation of the parallel test is performed.

In an embodiment, a semiconductor device may include an even data input circuit configured to store, in an even core cell, data that is input through an even data pad and that has a first pattern in response to an even data input strobe signal in a write operation of a parallel test, an odd data input circuit configured to store, in an odd core cell, data that is input through an even data pad and that has a second pattern in response to an odd data input strobe signal in the write operation of the parallel test, and an even repeater configured to generate even read driving data by repeating even read core data that is output by the even core cell or odd buffer data, in response to a test mode signal and a read strobe signal when a read operation of the parallel test is performed.

BRIEF DESCRIPTION OF THE DRAWINGS

FIG. 8 is a table for describing an operation of the comparison code generation circuit illustrated in FIG. 7.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

A "logic bit set" may mean a combination of logic levels of bits included in a signal. When a logic level of each of the bits included in the signal is changed, a logic bit set of the signal may be differently set. For example, if two bits are included in a signal, a logic bit set of the signal may be set as a first logic bit set when logic levels of the two bits included in the signal are a "logic low level" and a "logic low level", and may be set as a second logic bit set when logic levels of the two bits included in the signal are a "logic low level", and a "logic high level."

Hereafter, the present disclosure will be described in more detail through embodiments. The embodiments are only used to exemplify the present disclosure, and the scope of the present disclosure is not limited by the embodiments.

Figure 1:
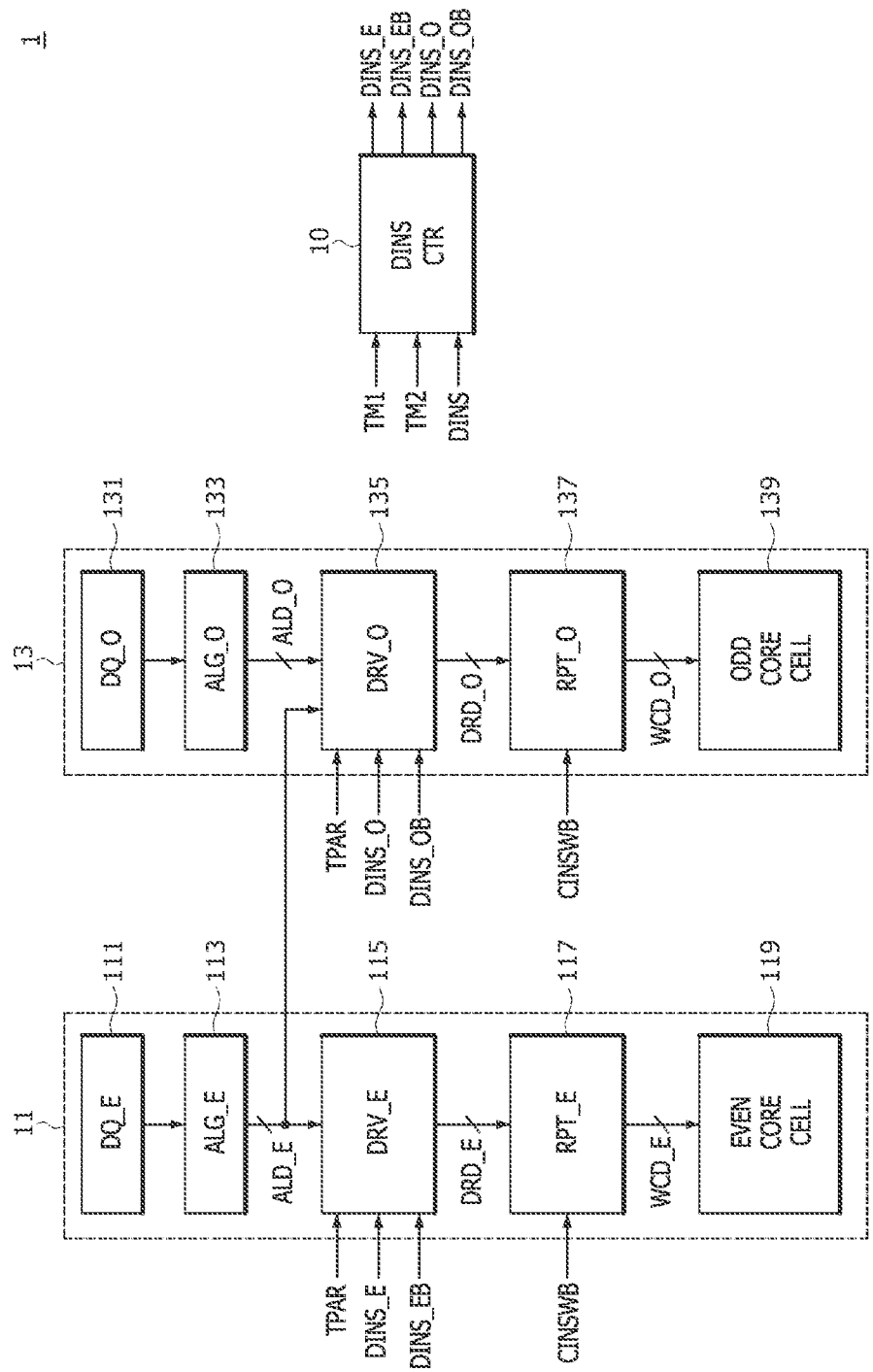
FIG. 1 is a block diagram illustrating a construction of a semiconductor device according to an example of the present disclosure.

FIG. 1 is a block diagram illustrating a construction of a semiconductor device 1 according to an example of the present disclosure. As illustrated in FIG. 1, the semiconductor device 1 may include a data input strobe signal control circuit (DINS CTR) 10, an even data input circuit 11, and an odd data input circuit 13. The data input strobe signal control circuit 10 may generate an even data input strobe signal DINS_E, an inverted even data input strobe signal DINS_EB, an odd data input strobe signal DINS_O, and an inverted odd data input strobe signal DINS_OB, in response to a data input strobe signal DINS that is generated when a write operation of a parallel test is performed. The even data input circuit 11 may store, in an even core cell (EVEN CORE CELL) 119, data (D1 in FIG. 5) that has a first pattern and that is input through an even data pad (DQ_E) 111, in response to the even data input strobe signal DINS_E and the inverted even data input strobe signal DINS_EB. The odd data input circuit 13 may store, in an odd core cell (ODD CORE CELL) 139, data (D2 in FIG. 5) that has a second pattern and that is input through the even data pad 111, in response to the odd data input strobe signal DINS_O and the inverted odd data input strobe signal DINS_OB when a write operation of the parallel test is performed.

The data input strobe signal control circuit 10 may generate the even data input strobe signal DINS_E, the inverted even data input strobe signal DINS_EB, the odd data input strobe signal DINS_O, and the inverted odd data input strobe signal DINS_OB, in response to a first test mode signal TM1, a second test mode signal TM2, and the data input strobe signal DINS. The data input strobe signal DINS, the first test mode signal TM1, and the second test mode signal TM2 may be generated based on a command (not illustrated) or an address (not illustrated) that is applied by a controller (1002 in FIG. 13). The first test mode signal TM1 may be enabled in order to fix logic levels of the even data input strobe signal DINS_E and the inverted even data input strobe signal DINS_EB and to generate the odd data input strobe signal DINS_O and the inverted odd data input strobe signal DINS_OB in response to the data input strobe signal DINS. The second test mode signal TM2 may be enabled in order to fix logic levels of the odd data input strobe signal DINS_O and the inverted odd data input strobe signal DINS_OB and to generate the even data input strobe signal DINS_E and the inverted even data input strobe signal DINS_EB in response to the data input strobe signal DINS.

The even data input circuit 11 may include the even data pad (DQ_E) 111, an even alignment circuit (ALG_E) 113, an even driving circuit (DRV_E) 115, an even repeater (RPT_E) 117, and the even core cell (EVEN CORE CELL) 119. The even alignment circuit 113 may generate even alignment data ALD_E by aligning data that are input through the even data pad 111, when a write operation of a parallel test is performed or a normal write operation is performed. The normal write operation may indicate a write operation that is performed in the state in which a parallel test is not performed. The even alignment circuit 113 may be connected to the even driving circuit 115, and may supply the even alignment data ALD_E to the even driving circuit 115. The even driving circuit 115 may drive even driving data DRD_E based on the even alignment data ALD_E, in response to a parallel test signal TPAR, the even data input strobe signal DINS_E, and the inverted even data input strobe signal DINS_EB. The even driving circuit 115 may drive the even driving data DRD_E based on the even alignment data ALD_E, in response to the even data input strobe signal DINS_E and the inverted even data input strobe signal DINS_EB, when the write operation of the parallel test is performed or the normal write operation is performed. The parallel test signal TPAR may be enabled for the parallel test. The even driving circuit 115 may be connected to the even repeater 117, and may supply the even driving data DRD_E to the even repeater 117. The even repeater 117 may generate even write core data WCD_E by repeating the even driving data DRD_E in response to a write strobe signal CINSWB, when the write operation of the parallel test is performed or the normal write operation is performed. The write strobe signal CINSWB may be enabled when the write operation of the parallel test is performed or the normal write operation is performed. The even repeater 117 may be connected to the even core cell 119, and may supply the even write core data WCD_E to the even core cell 119. The even core cell 119 may include multiple memory cells (not illustrated) that are accessed when the write operation of the parallel test or the normal write operation is performed, and may store the even write core data WCD_E.

The odd data input circuit 13 may include an odd data pad (DQ_O) 131, an odd alignment circuit (ALG_O) 133, an odd driving circuit (DRV_O) 135, an odd repeater (RPT_O) 137, and the odd core cell (ODD CORE CELL) 139. The odd alignment circuit 133 may generate odd alignment data ALD_O by aligning data that are input through the odd data pad 131 when the write operation of the parallel test is performed or the normal write operation is performed. The odd alignment circuit 133 may be connected to the odd driving circuit 135, and may supply the odd alignment data ALD_O to the odd driving circuit 135. The odd driving circuit 135 may drive odd driving data DRD_O based on the odd alignment data ALD_O, in response to the parallel test signal TPAR, the odd data input strobe signal DINS_O, and the inverted odd data input strobe signal DINS_OB. The odd driving circuit 135 may drive the odd driving data DRD_O based on the even alignment data ALD_E in response to the odd data input strobe signal DINS_O and the inverted odd data input strobe signal DINS_OB when the write operation of the parallel test is performed. The odd driving circuit 135 may drive the odd driving data DRD_O based on the odd alignment data ALD_O, in response to the odd data input strobe signal DINS_O and the inverted odd data input strobe signal DINS_OB, when the write operation is performed. The odd driving circuit 135 may be connected to the odd repeater 137, and may supply the odd driving data DRD_O to the odd repeater 137. The odd repeater 137 may generate odd write core data WCD_O by repeating the odd driving data DRD_O in response to the write strobe signal CINSWB when the write operation of the parallel test is performed or the normal write operation is performed. The odd repeater 137 may be connected to the odd core cell 139, and may supply the odd write core data WCD_O to the odd core cell 139. The odd core cell 139 may include multiple memory cells (not illustrated) that are accessed when the write operation of the parallel test or the normal write operation is performed, and may store the odd write core data WCD_O.

Figure 2:
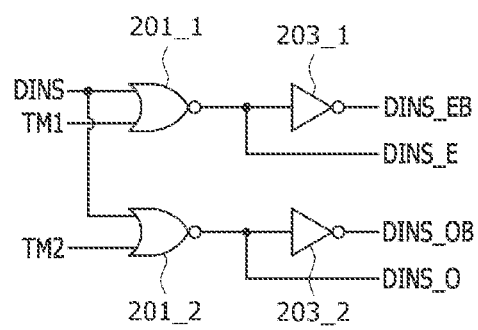
FIG. 2 is a circuit diagram according to an example of a data input strobe signal control circuit that is included in the semiconductor device illustrated in FIG. 1.

FIG. 2 may be a circuit diagram of a data input strobe signal control circuit 10A according to an example of the data input strobe signal control circuit 10. As illustrated in FIG. 2, the data input strobe signal control circuit 10A may include NOR gates 201_1 and 201_2 and inverters 203_1 and 203_2. The NOR gate 201_1 may generate the even data input strobe signal DINS_E by receiving the data input strobe signal DINS and the first test mode signal TM1 and performing a NOR operation. The inverter 203_1 may generate the inverted even data input strobe signal DINS_EB by inverting and buffering the even data input strobe signal DINS_E. The NOR gate 201_1 and the inverter 203_1 may fix the level of the even data input strobe signal DINS_E to a logic low level and fix the level of the inverted even data input strobe signal DINS_EB to a logic high level, when the first test mode signal TM1 is enabled to a logic high level. The NOR gate 201_1 and the inverter 203_1 may generate the even data input strobe signal DINS_E by inverting and buffering the data input strobe signal DINS and generate the inverted even data input strobe signal DINS_EB by buffering the data input strobe signal DINS, when the first test mode signal TM1 is disabled to a logic low level. The NOR gate 201_2 may generate the odd data input strobe signal DINS_O by receiving the data input strobe signal DINS and the second test mode signal TM2 and performing a NOR operation. The inverter 203_2 may generate the inverted odd data input strobe signal DINS_OB by inverting and buffering the odd data input strobe signal DINS_O. The NOR gate 201_2 and the inverter 203_2 may fix the level of the odd data input strobe signal DINS_O to a logic low level and fix the level of the inverted odd data input strobe signal DINS_OB to a logic high level, when the second test mode signal TM2 is enabled to a logic high level. The NOR gate 201_2 and the inverter 203_2 may generate the odd data input strobe signal DINS_O by inverting and buffering the data input strobe signal DINS and generate the inverted odd data input strobe signal DINS_OB by buffering the data input strobe signal DINS, when the second test mode signal TM2 is disabled to a logic low level.

Figure 3:
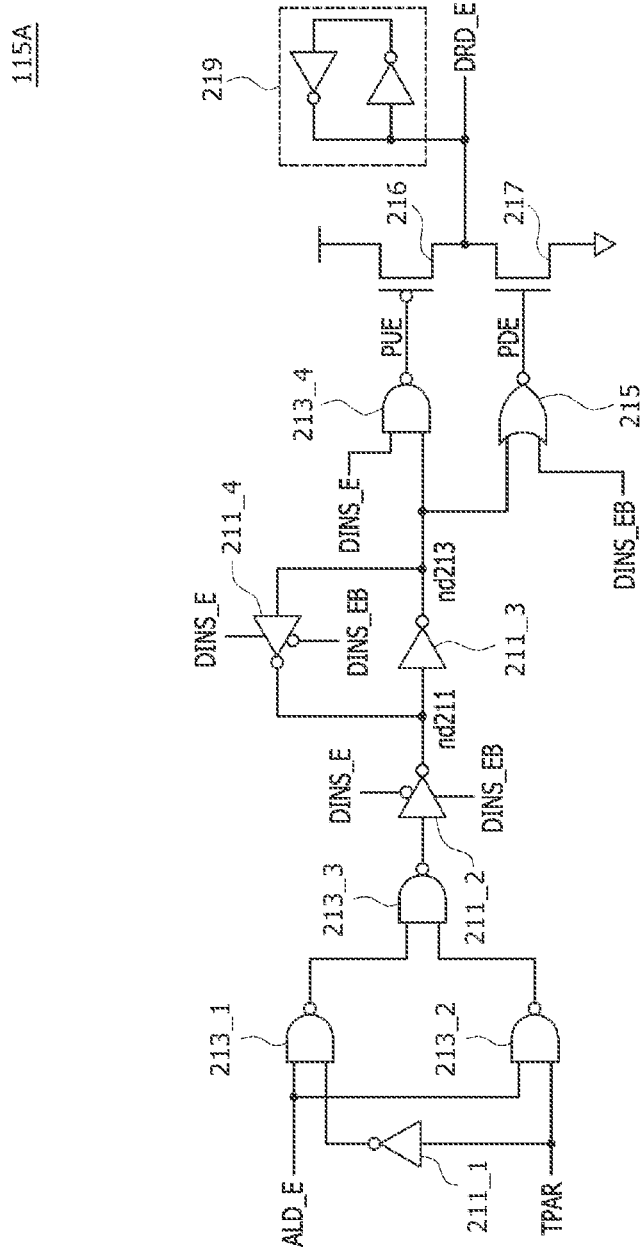
FIG. 3 is a circuit diagram according to an example of an even driving circuit that is included in the semiconductor device illustrated in FIG. 1.

FIG. 3 may be a circuit diagram of an even driving circuit 115A according to an example of the even driving circuit 115. As illustrated in FIG. 3, the even driving circuit 115A may include inverters 211_1 to 211_4, NAND gates 213_1 to 213_4, a NOR gate 215, a PMOS transistor 216, an NMOS transistor 217, and a latch circuit 219. The inverter 211_1 may invert and buffer the parallel test signal TPAR. The NAND gate 213_1 may perform a NAND operation by receiving the even alignment data ALD_E and the output signal of the inverter 211_1. The NAND gate 213_2 may perform a NAND operation by performing the even alignment data ALD_E and the parallel test signal TPAR. The NAND gate 213_3 may perform a NAND operation by receiving the output signal of the NAND gate 213_1 and the output signal of the NAND gate 213_2. The inverter 211_2 may output the output signal of the NAND gate 213_3 to a node nd211 by inverting and buffering the output signal of the NAND gate 213_3, when the level of the inverted even data input strobe signal DINS_EB is a logic high level and the level of the even data input strobe signal DINS_E is a logic low level. The inverter 211_3 may output the signal of the node nd211 to a node nd213 by inverting and buffering the signal of the node nd211. The inverter 211_4 may output the signal of the node nd213 to the node nd211 by inverting and buffering the signal of the node nd213, when the level of the inverted even data input strobe signal DINS_EB is a logic low level and the level of the even data input strobe signal DINS_E is a logic high level. The NAND gate 213_1 may generate an even pull-up signal PUE by receiving the even data input strobe signal DINS_E and the signal of the node nd213 and performing a NAND operation. The NOR gate 215 may generate an even pull-down signal PDE by receiving the signal of the node nd213 and the inverted even data input strobe signal DINS_EB and performing a NOR operation. The PMOS transistor 216 may be turned on in response to the even pull-up signal PUE, and may drive the even driving data DRD_E to a logic high level. The NMOS transistor 217 may be turned on in response to the even pull-down signal PDE, and may drive the even driving data DRD_E to a logic low level. The latch circuit 219 may latch the even driving data DRD_E.

The even driving circuit 115A may receive the even alignment data ALD_E at the node nd213 through the NAND gates 213_1 to 213_3 and the inverters 211_2 and 211_3, when the level of the inverted even data input strobe signal DINS_EB is a logic high level and the level of the even data input strobe signal DINS_E is a logic low level, in the state in which a write operation of a parallel test is performed or a normal write operation is performed. The even driving circuit 115A may latch the signal of the node nd213 by the inverters 211_3, 211_4, when a logic level of the inverted even data input strobe signal DINS_EB transitions to a different logic level and a logic level of the even data input strobe signal DINS_E transitions to a different logic level in the state in which the write operation of the parallel test is performed or the normal write operation is performed. In an embodiment, the different logic level is not the same as the logic level. For example, the even driving circuit 115A may latch the signal of the node nd213 by the inverters 211_3, 211_4, when the level of the inverted even data input strobe signal DINS_EB transitions from a logic high level to a logic low level and the level of the even data input strobe signal DINS_E transitions from a logic low level to a logic high level in the state in which the write operation of the parallel test is performed or the normal write operation is performed. The even driving circuit 115A may drive the even driving data DRD_E in response to the signal of the node nd213, through the NAND gate 213_4, the NOR gate 215, the PMOS transistor 216, and the NMOS transistor 217.

Figure 4:
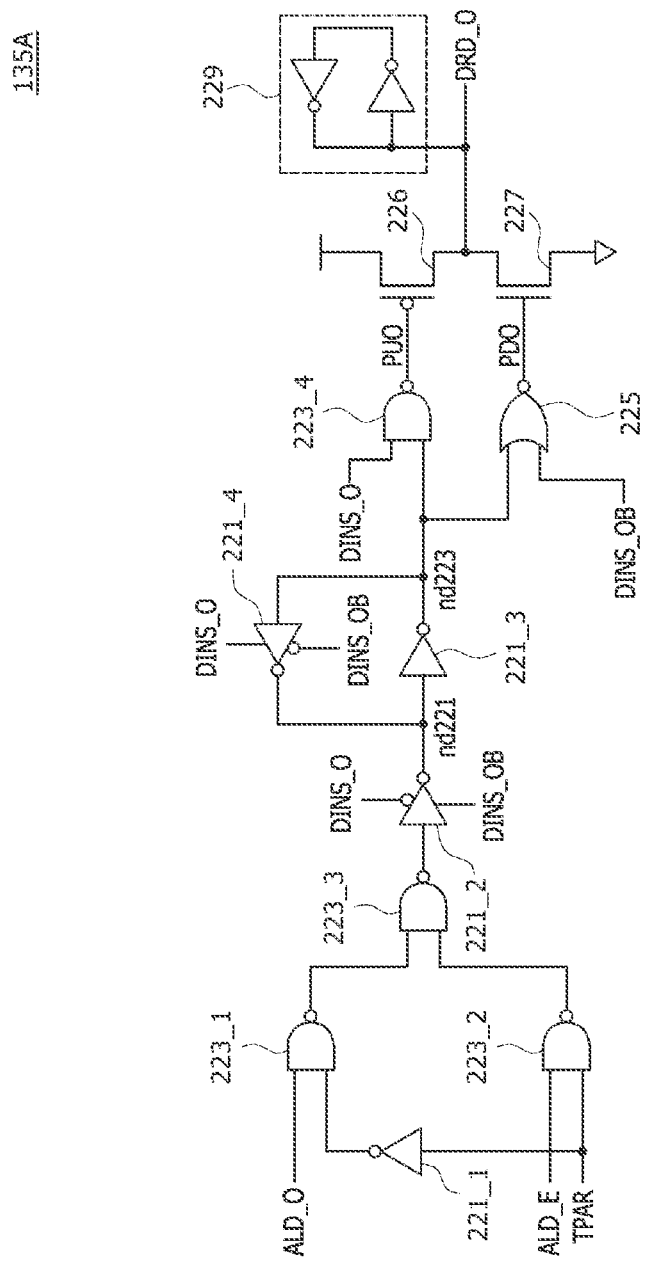
FIG. 4 is a circuit diagram according to an example of an odd driving circuit that is included in the semiconductor device illustrated in FIG. 1.

FIG. 4 may be a circuit diagram of an odd driving circuit 135A according to an example of the odd driving circuit 135. As illustrated in FIG. 4, the odd driving circuit 135A may include inverters 221_1 to 221_4, NAND gates 223_1 to 223_4, a NOR gate 225, a PMOS transistor 226, an NMOS transistor 227, and a latch circuit 229. The inverter 221_1 may invert and buffer the parallel test signal TPAR. The NAND gate 223_1 may perform a NAND operation by receiving the odd alignment data ALD_O and the output signal of the inverter 221_1. The NAND gate 223_2 may perform a NAND operation by receiving the even alignment data ALD_E and the parallel test signal TPAR. The NAND gate 223_3 may perform a NAND operation by receiving the output signal of the NAND gate 223_1 and the output signal of the NAND gate 223_2. The inverter 221_2 may output the output signal of the NAND gate 223_3 to a node nd221 by inverting and buffering the output signal of the NAND gate 223_3, when the level of the inverted odd data input strobe signal DINS_OB is a logic high level and the level of the odd data input strobe signal DINS_O is a logic low level. The inverter 221_3 may output the signal of the node nd221 to a node nd223 by inverting and buffering the signal of the node nd221. The inverter 221_4 may output the signal of the node nd223 to the node nd221 by inverting and buffering the signal of the node nd223, when the level of the inverted odd data input strobe signal DINS_OB is a logic low level and the level of the odd data input strobe signal DINS_O is a logic high level. The NAND gate 223_1 may generate an odd pull-up signal PUO by receiving the odd data input strobe signal DINS_O and the signal of the node nd223 and performing a NAND operation. The NOR gate 225 may perform a NOR operation on an odd pull-down signal PDO by receiving the signal of the node nd223 and the inverted odd data input strobe signal DINS_OB. The PMOS transistor 226 may be turned on in response to the odd pull-up signal PUO, and may drive the odd driving data DRD_O to a logic high level. The NMOS transistor 227 may be turned on in response to the odd pull-down signal PDO, and may drive the odd driving data DRD_O to a logic low level. The latch circuit 229 may latch the odd driving data DRD_O.

The odd driving circuit 135A may receive the even alignment data ALD_E at the node nd223 through the NAND gates 223_2 and 223_3 and the inverters 221_2 and 221_3 when the level of the inverted odd data input strobe signal DINS_OB is a logic high level and the level of the odd data input strobe signal DINS_O is a logic low level in the state in which the write operation of the parallel test is performed. The odd driving circuit 135A may transfer the odd alignment data ALD_O to the node nd223 through the NAND gates 223_1 and 223_3 and the inverters 221_2 and 221_3 when the level of the inverted odd data input strobe signal DINS_OB is a logic high level and the level of the odd data input strobe signal DINS_O is a logic low level in the state in which the normal write operation is performed. The odd driving circuit 135A may latch the signal of the node nd223 by the inverters 221_3 and 221_4 when the inverted odd data input strobe signal DINS_OB transitions from a logic level to a different logic level and the level of the odd data input strobe signal DINS_O transitions from a logic level to a different logic level in the state in which the write operation of the parallel test is performed or the normal write operation is performed. For example, the odd driving circuit 135A may latch the signal of the node nd223 by the inverters 221_3 and 221_4 when the inverted odd data input strobe signal DINS_OB transitions from a logic high level to a logic low level and the level of the odd data input strobe signal DINS_O transitions from a logic low level to a logic high level in the state in which the write operation of the parallel test is performed or the normal write operation is performed. The odd driving circuit 135A may drive the odd driving data DRD_O in response to the signal of the node nd223 through the NAND gate 223_4, the NOR gate 225, the PMOS transistor 226, and the NMOS transistor 227.

Figure 5:
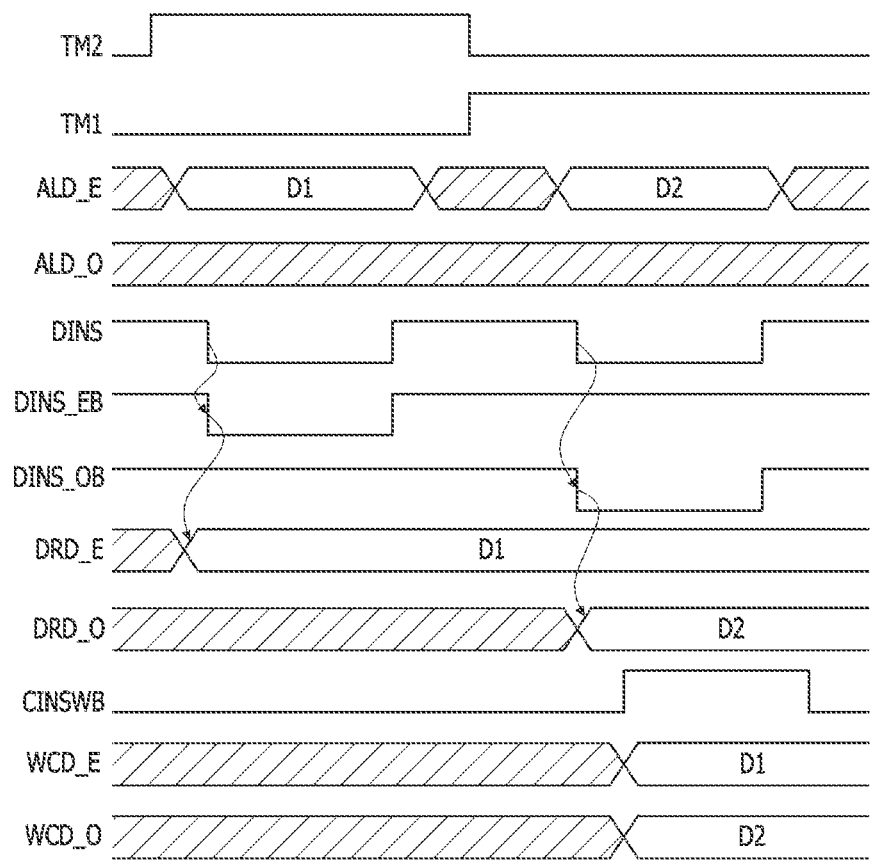
FIG. 5 is a timing diagram for describing a write operation of a parallel test that is performed by the semiconductor device illustrated in FIGS. 1 to 4.

FIG. 5 may be a timing diagram for describing a write operation of a parallel test that is performed by the semiconductor device 1.

As illustrated in FIG. 5, the inverted even data input strobe signal DINS_EB may be generated by the data input strobe signal DINS that is generated when a write operation of a parallel test is performed in the state in which the second test mode signal TM2 has been enabled to a logic high level. The even driving data DRD_E may be driven by the even alignment data ALD_E that is generated as the data D1 having the first pattern when the inverted even data input strobe signal DINS_EB is generated.

As illustrated in FIG. 5, the inverted odd data input strobe signal DINS_OB may be generated by the data input strobe signal DINS that is generated when the write operation of the parallel test is performed in the state in which the first test mode signal TM1 has been enabled to a logic high level. The odd driving data DRD_O may be driven by the even alignment data ALD_E that is generated as the data D2 having the second pattern when the inverted odd data input strobe signal DINS_OB is generated.

As illustrated in FIG. 5, in the state in which the write operation of the parallel test is performed and the even driving data DRD_E and the odd driving data DRD_O have been driven by the even alignment data ALD_E, when the write strobe signal CINSWB is enabled, the even write core data WCD_E may be generated by the even driving data DRD_E that has been driven as the data D1 having the first pattern, and the odd write core data WCD_O may be generated by the odd driving data DRD_O that has been driven as the data D2 having the second pattern.

As described above, the semiconductor device 1 may generate the even data input strobe signal DINS_E and the odd data input strobe signal DINS_O that are enabled in separate intervals in the write operation of the parallel test, may store the data D1 that has the first pattern and that is input as the even alignment data ALD_E in the even core cell 119 as the even write core data WCD_E in response to the even data input strobe signal DINS_E, and may store the data D2 that has the second pattern and that is input as the even alignment data ALD_E in the odd core cell 139 as the odd write core data WCD_O, in response to the odd data input strobe signal DINS_O.

Figure 6:
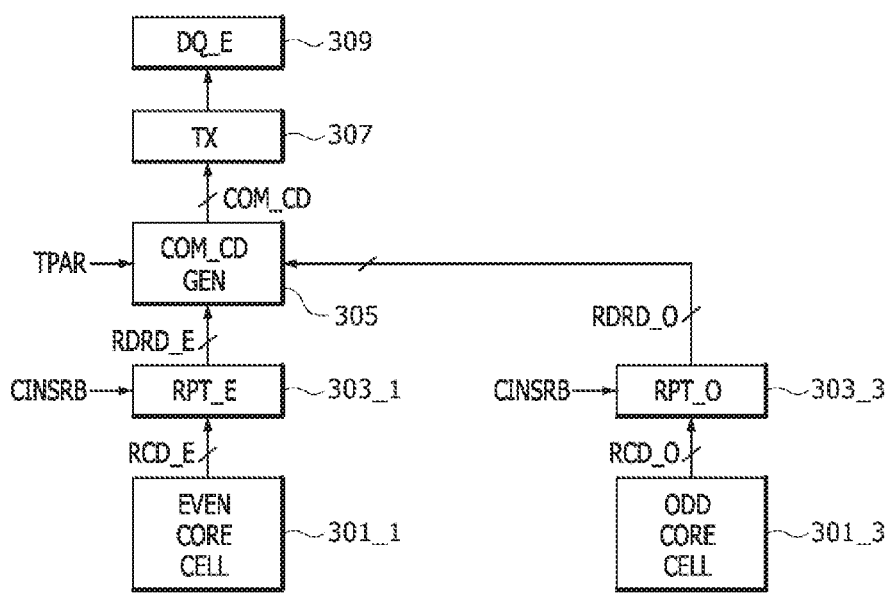
FIG. 6 is a block diagram illustrating a construction of a semiconductor device according to another embodiment of the present disclosure.

FIG. 6 is a block diagram illustrating a construction of a semiconductor device 3 according to another embodiment of the present disclosure. As illustrated in FIG. 6, the semiconductor device 3 may include an even core cell (EVEN CORE CELL) 301_1, an even repeater (RPT_E) 303_1, an odd core cell (ODD CORE CELL) 301_3, an odd repeater (RPT_O) 303_3, a comparison code generation circuit (COM_CD GEN) 305, a transmission circuit (TX) 307, and an even data pad (DQ_E) 309.

The even core cell 301_1 may output, as an even read core data RCD_E, the even write core data WCD_E that has been stored in a write operation of a parallel test, when a read operation of the parallel test is performed. The read operation of the parallel test may be performed after the write operation of the parallel test is performed. The even core cell 301_1 may be connected to the even repeater 303_1, and may supply the even read core data RCD_E to the even repeater 303_1.

The even repeater 303_1 may generate even read driving data RDRD_E by repeating the even read core data RCD_E in response to a read strobe signal CINSRB when the read operation of the parallel test is performed. The read strobe signal CINSRB may be enabled when the read operation of the parallel test is performed. The even repeater 303_1 may be connected to the comparison code generation circuit 305, and may supply the even read driving data RDRD_E to the comparison code generation circuit 305.

The odd core cell 301_3 may output, as odd read core data RCD_O, the odd write core data WCD_O that has been stored in the write operation of the parallel test, when the read operation of the parallel test is performed. The odd core cell 301_3 may be connected to the odd repeater 303_3, and may supply the odd read core data RCD_O to the odd repeater 303_3.

The odd repeater 303_3 may generate odd read driving data RDRD_O by repeating the odd read core data RCD_O in response to the read strobe signal CINSRB when the read operation of the parallel test is performed. The odd repeater 303_3 may be connected to the comparison code generation circuit 305, and may supply the odd read driving data RDRD_O to the comparison code generation circuit 305.

The comparison code generation circuit 305 may generate a comparison code COM_CD in response to the even read driving data RDRD_E and the odd read driving data RDRD_O in the parallel test. The comparison code generation circuit 305 may generate the comparison code COM_CD by comparing the even read driving data RDRD_E and the odd read driving data RDRD_O, when the parallel test is performed and a parallel test signal TPAR is enabled. The comparison code generation circuit 305 may generate the comparison code COM_CD having a level set as a first logic level when the even read driving data RDRD_E and the odd read driving data RDRD_O have the same logic level, and may generate the comparison code COM_CD having a level set as a second logic level when the even read driving data RDRD_E and the odd read driving data RDRD_O have different logic levels. In the present embodiment, the first logic level may be set as a logic low level, and the second logic level may be set as a logic high level. However, such an embodiment is merely an example, and the present disclosure is not limited thereto. The comparison code generation circuit 305 may be connected to the transmission circuit 307, and may supply the comparison code COM_CD to the transmission circuit 307.

The transmission circuit 307 may output, to the even data pad 309, the comparison code COM_CD that is supplied by the comparison code generation circuit 305 when the read operation of the parallel test is performed. Whether data stored in each of the even core cell 301_1 and the odd core cell 301_3 fails may be checked based on the comparison code COM_CD that is output to the even data pad 309. For example, in the write operation of the parallel test, when the even write core data WCD_E that is stored in the even core cell 301_1 is set as a first pattern of, for example but not limited to, "1001" and the odd write core data WCD_O that is stored in the odd core cell 301_3 is set as a second pattern of, for example but not limited to, "1100", whether all bits included in the data stored in each of the even core cell 301_1 and the odd core cell 301_3 are normal is checked only when the comparison code COM_CD is generated as a pattern of "0101". When the comparison code COM_CD is generated as a pattern of "0100", the presence of a fail in the first bit of the data that has been stored in the even core cell 301_1 or the first bit of the data that has been stored in the odd core cell 301_3 can be checked.

As described above, the semiconductor device 3 can check whether data stored in each of the even core cell 301_1 and the odd core cell 301_3 is a fail for each bit based on the comparison code COM_CD that is output by the even data pad 309, by comparing the data that is output by the even core cell 301_1 and the data that is output by the odd core cell 301_3, generating the comparison code COM_CD, and outputting the comparison code COM_CD to the even data pad 309 when the read operation of the parallel test is performed.

Figure 7:
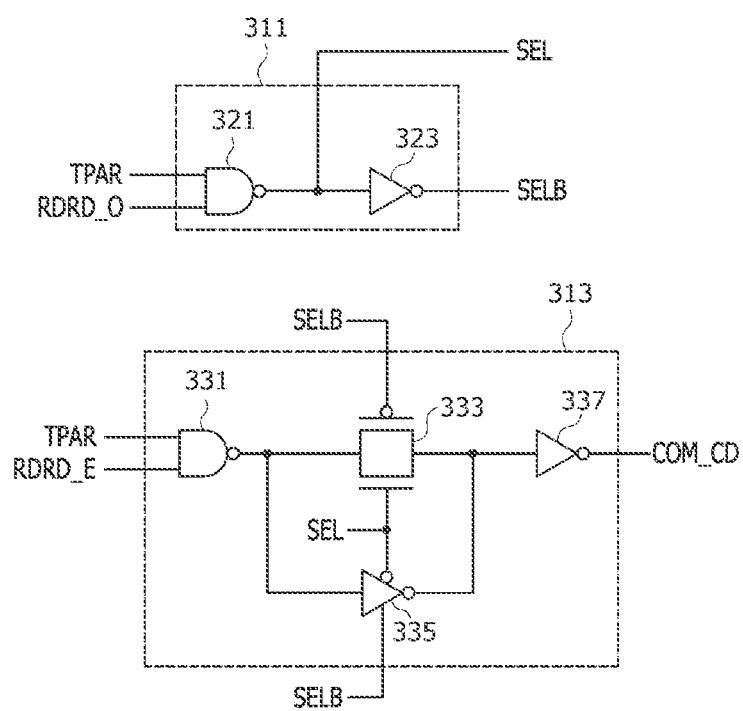
FIG. 7 is a circuit diagram according to an example of a comparison code generation circuit that is included in the semiconductor device illustrated in FIG. 6.

FIG. 7 may be a circuit diagram of a comparison code generation circuit 305A according to an example of the comparison code generation circuit 305. As illustrated in FIG. 7, the comparison code generation circuit 305A may include a selection signal generation circuit 311 and a selection output circuit 313.

The selection signal generation circuit 311 may include inverters 321 and 323. The inverter 321 may generate a selection signal SEL by receiving a parallel test signal TPAR and odd read driving data RDRD_O and performing a NAND operation. The inverter 323 may generate an inverted selection signal SELB by inverting and buffering the selection signal SEL.

The selection output circuit 313 may include a NAND gate 331, a transfer gate 333, and inverters 335 and 337. The NAND gate 331 may perform a NAND operation by receiving the parallel test signal TPAR and even read driving data RDRD_E. The transfer gate 333 may be turned on when receiving the selection signal SEL having a logic high level and the inverted selection signal SELB having a logic low level, and may transfer the output signal of the NAND gate 331. The inverter 335 may output the output signal of the NAND gate 331 by inverting and buffering the output signal of the NAND gate 331, when receiving the selection signal SEL having a logic low level and the inverted selection signal SELB having a logic high level. The inverter 337 may output the comparison code COM_CD by inverting and buffering the output signal of the transfer gate 333 or the output signal of the inverter 335.

An operation of the comparison code generation circuit 305A may be described as follows with reference to FIGS. 7 and 8.

Figure 8:
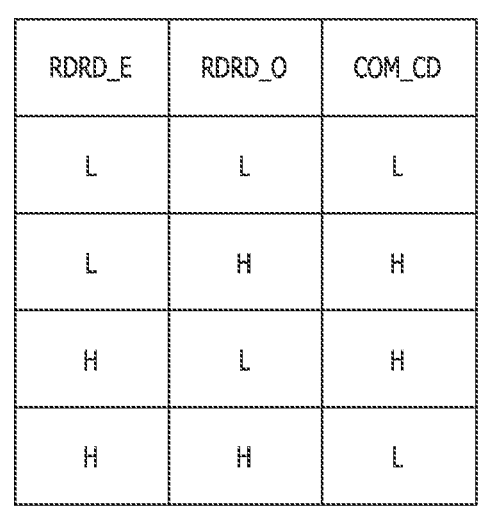

As illustrated in FIGS. 7 and 8, in the state in which a parallel test is performed and the parallel test signal TPAR having a logic high level is received, when the level of the odd read driving data RDRD_O is a logic low level (i.e., L), the selection signal SEL having a logic high level may be generated, and the inverted selection signal SELB having a logic low level may be generated. Accordingly, the comparison code COM_CD may be generated to have the same logic level as the even read driving data RDRD_E the transfer gate 333 that is turned on. That is, the comparison code COM_CD having a logic low level may be generated when the level of the odd read driving data RDRD_O is a logic low level and the level of the even read driving data RDRD_E is a logic low level. Furthermore, the comparison code COM_CD having a logic high level (i.e., H) may be generated when the level of the odd read driving data RDRD_O is a logic low level and the level of the even read driving data RDRD_E is a logic high level. In the parallel test, when the level of the odd read driving data RDRD_O is a logic high level, the selection signal SEL having a logic low level may be generated, and the inverted selection signal SELB having a logic high level may be generated. Accordingly, the comparison code COM_CD may be generated to have a logic level by inverting and buffering the even read driving data RDRD_E through the inverter 335. That is, the comparison code COM_CD having a logic high level may be generated when the level of the odd read driving data RDRD_O is a logic high level and the level of the even read driving data RDRD_E is a logic low level. Furthermore, the comparison code COM_CD having a logic low level may be generated when the level of the odd read driving data RDRD_O is a logic high level and the level of the even read driving data RDRD_E is a logic high level. As a result, it may be seen that the comparison code generation circuit 305A operates as a NOR device that performs a NOR operation by receiving the odd read driving data RDRD_O and the even read driving data RDRD_E.

Figure 9:
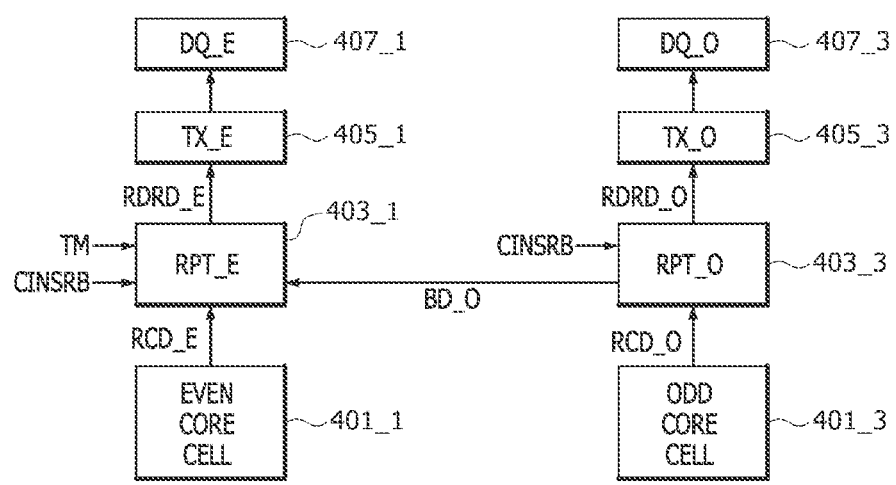
FIG. 9 is a block diagram illustrating a construction of a semiconductor device according to still another example of the present disclosure.

FIG. 9 is a block diagram illustrating a construction of a semiconductor device 4 according to still another example of the present disclosure. As illustrated in FIG. 9, the semiconductor device 4 may include an even core cell (EVEN CORE CELL) 401_1, an odd core cell (ODD CORE CELL) 401_3, an even repeater (RPT_E) 403_1, an odd repeater (RPT_O) 403_3, an even transmission circuit (TX_E) 405_1, an even data pad (DQ_E) 407_1, an odd transmission circuit (TX_O) 405_3, and an odd data pad (DQ_O) 407_3.

The even core cell 401_1 may output, as even read core data RCD_E, the even write core data WCD_E that has been stored in a write operation of a parallel test, when a read operation of the parallel test is performed. The even core cell 401_1 may be connected to the even repeater 403_1, and may supply the even read core data RCD_E to the even repeater 403_1.

The odd core cell 401_3 may output, as odd read core data RCD_O, the odd write core data WCD_O that has been stored in the write operation of the parallel test, when the read operation of the parallel test is performed. The odd core cell 401_3 may be connected to the odd repeater 403_3, and may supply the odd read core data RCD_O to the odd repeater 403_3.

The even repeater 403_1 may generate even read driving data RDRD_E by repeating the even read core data RCD_E or odd buffer data BD_O in response to a test mode signal TM and a read strobe signal CINSRB when the read operation of the parallel test is performed. The read strobe signal CINSRB may be enabled when the read operation of the parallel test is performed. The test mode signal TM may be set to have the first logic level for a first repetition interval that is entered when the read operation of the parallel test is performed, and may be then set to have the second logic level for a second repetition interval that is entered after the first repetition interval is terminated. The even repeater 403_1 may output the even read core data RCD_E as the even read driving data RDRD_E by repeating the even read core data RCD_E, when receiving the test mode signal TM having a level set as the first logic level for the first repetition interval, and may output the odd buffer data BD_O as the even read driving data RDRD_E by repeating the odd buffer data BD_O, when receiving the test mode signal TM having a level set as the second logic level for the second repetition interval. The even repeater 403_1 may be connected to the even transmission circuit 405_1, and may supply the even read driving data RDRD_E to the even transmission circuit 405_1.

The odd repeater 403_3 may generate the odd buffer data BD_O and odd read driving data RDRD_O by repeating the odd read core data RCD_O in response to the read strobe signal CINSRB when the read operation of the parallel test is performed or a normal read operation is performed. The normal read operation may indicate a read operation that is performed in the state in which a parallel test is not performed. The odd buffer data BD_O may be generated before the odd read driving data RDRD_O is generated. The odd repeater 403_3 may be connected to the odd transmission circuit 405_3, and may supply the odd read driving data RDRD_O to the odd transmission circuit 405_3 when the normal read operation is performed.

The even transmission circuit 405_1 may output, to the even data pad 407_1, the even read driving data RDRD_E that is supplied by the even repeater 403_1 when the read operation of the parallel test is performed. The odd transmission circuit 405_3 may output the odd read driving data RDRD_O to the odd data pad (DQ_O) 407_3 when the normal read operation is performed. Whether data that has been stored in each of the even core cell 401_1 and the odd core cell 401_3 fails can be checked based on the even read driving data RDRD_E that is output to the even data pad 407_1. More specifically, in the first repetition interval, when the even read core data RCD_E is repeated and output as the even read driving data RDRD_E, whether the data that has been stored in the even core cell 401_1 fails may be checked based on the even read driving data RDRD_E that is output to the even data pad 407_1. Furthermore, in the second repetition interval, when the odd buffer data BD_O is repeated and output as the even read driving data RDRD_E, whether the data that has been stored in the odd core cell 401_3 fails may be checked based on the even read driving data RDRD_E that is output to the even data pad 407_1.

Figure 10:
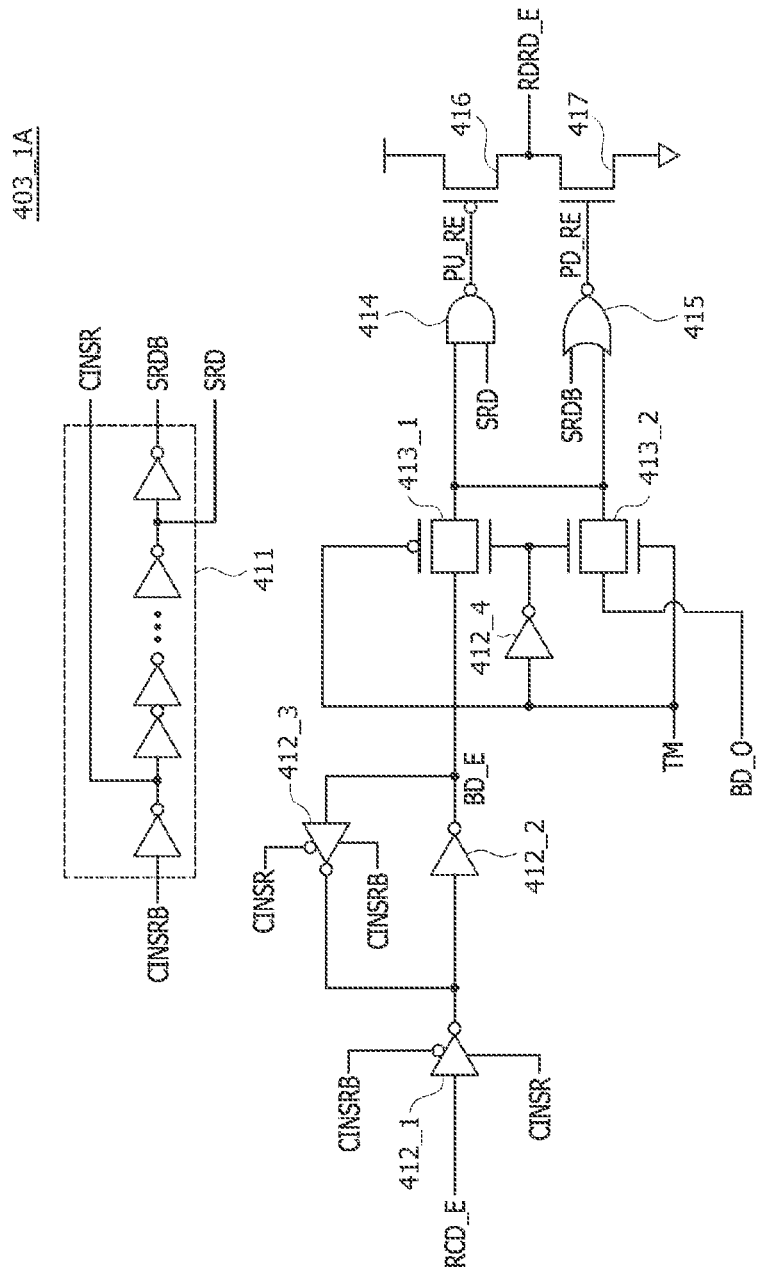
FIG. 10 is a circuit diagram according to an example of an even repeater that is included in the semiconductor device illustrated in FIG. 9.

FIG. 10 may be a circuit diagram of an even repeater 403_1A according to an example of the even repeater 403_1. As illustrated in FIG. 10, the even repeater 403_1A may include an inversion delay circuit 411, inverters 412_1 to 412_4, transfer gates 413_1 and 413_2, a NAND gate 414, a NOR gate 415, a PMOS transistor 416, and an NMOS transistor 417. The inversion delay circuit 411 may generate an inverted read strobe signal CINSR by inverting and buffering a read strobe signal CINSRB, may generate a delay strobe signal SRD by delaying the read strobe signal CINSRB by a preset delay interval, and may generate an inverted delay strobe signal SRDB by inverting and buffering the delay strobe signal SRD. The inverter 412_1 may output the even read core data RCD_E by inverting and buffering the even read core data RCD_E, when receiving the read strobe signal CINSRB having a logic low level and the inverted read strobe signal CINSR having a logic high level. The inverter 412_2 may output the output signal of the inverter 412_1 by inverting and buffering the output signal of the inverter 412_1. The inverter 412_3 may output the output signal of the inverter 412_2 by inverting and buffering the output signal of the inverter 412_2, when receiving the read strobe signal CINSRB having a logic high level and the inverted read strobe signal CINSR having a logic low level. The inverter 412_4 may invert and buffer the test mode signal TM. The transfer gate 413_1 may transfer, to the NAND gate 414 and the NOR gate 415, the even read core data RCD_E that has been buffered through the inverters 412_1 and 412_2, when receiving the test mode signal TM having a level set as a logic low level for the first repetition interval. The transfer gate 413_2 may transfer the odd buffer data BD_O to the NAND gate 414 and the NOR gate 415 when receiving the test mode signal TM having a level set as a logic high level for the second repetition interval. The NAND gate 414 may generate an even read pull-up signal PU_RE by receiving the buffered even read core data RCD_E and delay strobe signal SRD that are transferred through the transfer gate 413_1 and performing a NAND operation, when receiving the test mode signal TM having a level set as a logic low level for the first repetition interval. The NAND gate 414 may generate the even read pull-up signal PU_RE by receiving the odd buffer data BD_O and the delay strobe signal SRD that are transferred through the transfer gate 413_2 and performing a NAND operation, when receiving the test mode signal TM having a level set as a logic high level for the second repetition interval. The NOR gate 415 may generate an even read pull-down signal PD_RE by receiving the buffered even read core data RCD_E and the inverted delay strobe signal SRDB that are received through the transfer gate 413_1 and performing a NOR operation, when receiving the test mode signal TM having a level set as a logic low level for the first repetition interval. The NOR gate 415 may generate the even read pull-down signal PD_RE by receiving the odd buffer data BD_O and the inverted delay strobe signal SRDB that are transferred through the transfer gate 413_2 and performing a NOR operation, when receiving the test mode signal TM having a level set as a logic high level for the second repetition interval. The PMOS transistor 416 may be turned on in response to the even read pull-up signal PU_RE, and may drive the even read driving data RDRD_E to a logic high level. The NMOS transistor 417 may be turned on in response to the even read pull-down signal PD_RE, and may drive the even read driving data RDRD_E to a logic low level.

Figure 11:
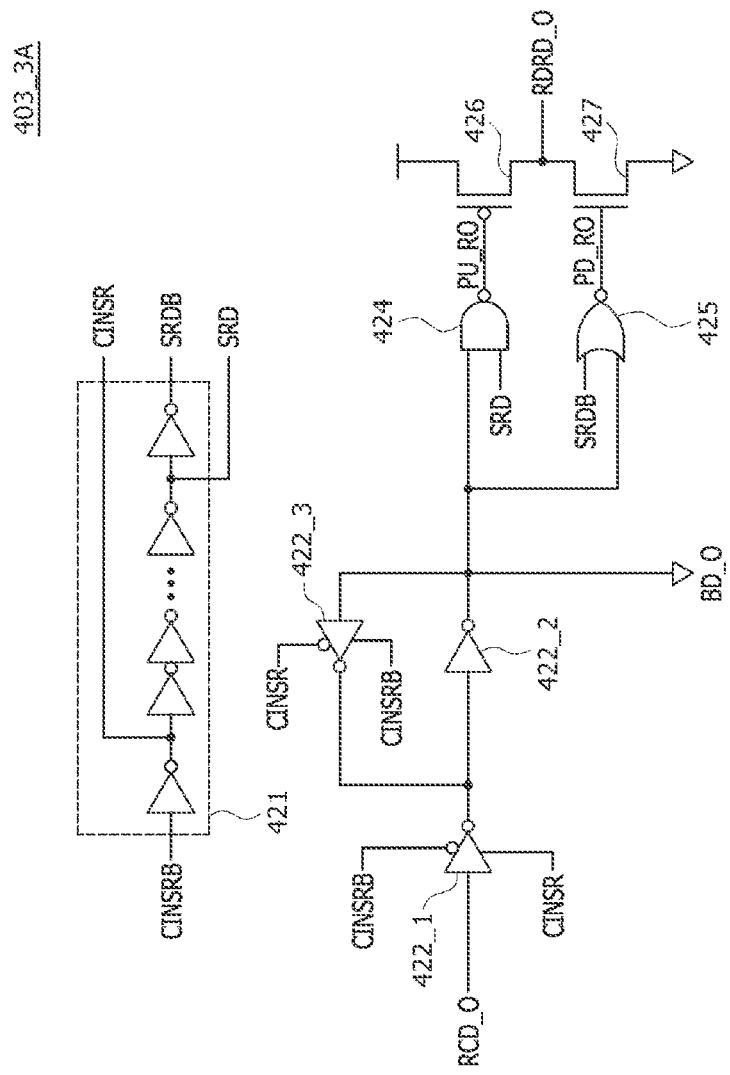
FIG. 11 is a circuit diagram according to an example of an odd repeater that is included in the semiconductor device illustrated in FIG. 9.

FIG. 11 may be a circuit diagram of an odd repeater 403_3A according to an example of the odd repeater 403_3. As illustrated in FIG. 10, the odd repeater 403_3A may include an inversion delay circuit 421, inverters 422_1 to 422_3, a NAND gate 424, a NOR gate 425, a PMOS transistor 426, and an NMOS transistor 427. The inversion delay circuit 421 may generate an inverted read strobe signal CINSR by inverting and buffering the read strobe signal CINSRB, may generate a delay strobe signal SRD by delaying the read strobe signal CINSRB by a preset delay interval, and may generate an inverted delay strobe signal SRDB by inverting and buffering the delay strobe signal SRD. The inverter 422_1 may output the odd read core data RCD_O by inverting and buffering the odd read core data RCD_O, when receiving the read strobe signal CINSRB having a logic low level and the inverted read strobe signal CINSR having a logic high level. The inverter 422_2 may generate the odd buffer data BD_O by inverting and buffering the output signal of the inverter 422_1, and may supply the odd buffer data BD_O to the transfer gate 413_2 of the even repeater 403_1 illustrated in FIG. 10. The inverter 422_3 may output the output signal of the inverter 422_2 by inverting and buffering the output signal of the inverter 422_2, when receiving the read strobe signal CINSRB having a logic high level and the inverted read strobe signal CINSR having a logic low level. The NAND gate 424 may generate an odd read pull-up signal PU_RO by receiving the odd buffer data BD_O and the delay strobe signal SRD and performing a NAND operation. The NOR gate 425 may generate an odd read pull-down signal PD_RO by receiving the odd buffer data BD_O and the inverted delay strobe signal SRDB and performing a NOR operation. The PMOS transistor 426 may be turned on in response to the odd read pull-up signal PU_RO, and may drive the odd read driving data RDRD_O to a logic high level. The NMOS transistor 427 may be turned on in response to the odd read pull-down signal PD_RO, and may drive the odd read driving data RDRD_O to a logic low level.

The read operation of the parallel test may be described as follows with reference to FIGS. 9 to 12.

Figure 12:
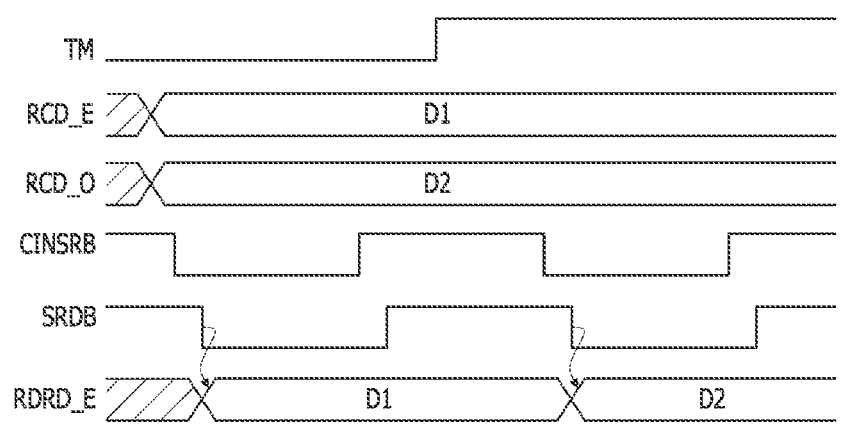
FIG. 12 is a timing diagram for describing a read operation of a parallel test that is performed by the semiconductor device illustrated in FIGS. 9 to 11.

As illustrated in FIGS. 9, 10, and 12, in the first repetition interval that is entered when the read operation of the parallel test is performed, when the level of the test mode signal TM is set as a logic low level, the even repeater 403_1 may buffer the even read core data RCD_E in synchronization with the read strobe signal CINSRB, and may drive the even read driving data RDRD_E as a first pattern D1 based on the buffered even read core data RCD_E in synchronization with the inverted delay strobe signal SRDB.

Furthermore, as illustrated in FIGS. 9, 10, and 12, in the second repetition interval that is entered after the first repetition interval is terminated, when the level of the test mode signal TM is set as a logic high level, the even repeater 403_1 may drive the even read driving data RDRD_E as a second pattern D2 based on the odd buffer data BD_O.

As described above, the semiconductor device 4 has an effect in that the semiconductor device 4 can check whether data stored in the even core cell 401_1 and the odd core cell 401_3 fails based on data that is output through the even data pad 407_1 by outputting the even read core data RCD_E having the first pattern D1, which is output by the even core cell 401_1, and the odd read core data RCD_O having the second pattern D2, which is output by the odd core cell 401_3, through the even data pad 407_1 when the read operation of the parallel test is performed.

The semiconductor device 1 described with reference to FIG. 1, the semiconductor device 3 described with reference to FIG. 6, and the semiconductor device 4 described with reference to FIG. 9 may be applied to electronic systems including a memory system, a graphic system, a computing system, and a mobile system. For example, referring to FIG. 13, an electronic system 1000 according to an embodiment of the present disclosure may include a data storage unit 1001, the memory controller 1002, buffer memory 1003, and an input and output (I/O) interface 1004.

The data storage unit 1001 may store data (not illustrated) that is applied by the memory controller 1002, read the stored data (not illustrated), and output the read data to the memory controller 1002, in response to a control signal from the memory controller 1002. The data storage unit 1001 may include nonvolatile memory capable of continuously storing data without losing the data although power is blocked. The nonvolatile memory may be implemented as flash memory (e.g., NOR flash memory or NAND flash memory), phase change random access memory (PRAM), resistive random access memory (RRAM), spin transfer torque random access memory (STTRAM), or magnetic random access memory (MRAM).

Figure 13:
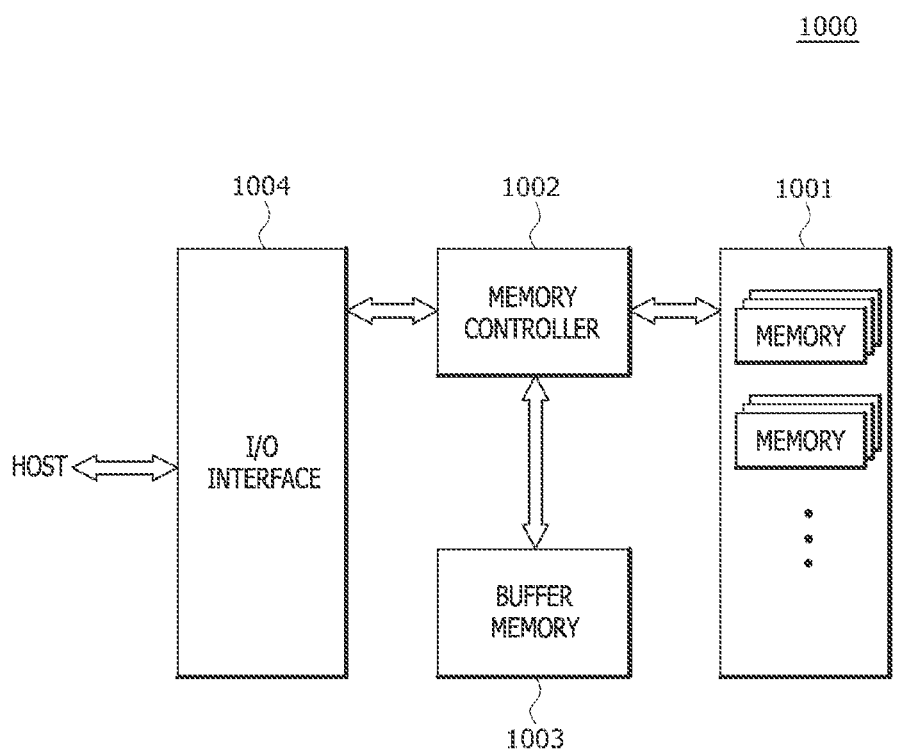
FIG. 13 is a block diagram illustrating a construction of an electronic system according to an example of the present disclosure.

The memory controller 1002 may decode an instruction that is applied by an external device (or a host device) through the I/O interface 1004, and may control the input and output of data to and from the data storage unit 1001 and the buffer memory 1003 based on the results of the decoding. In FIG. 13, the memory controller 1002 has been indicated as one block, but the memory controller 1002 may include a controller for controlling the data storage unit 1001 and a controller for controlling the buffer memory 1003, that is, volatile memory, which are independently constructed.

The buffer memory 1003 may store data to be processed by the memory controller 1002, that is, data (not illustrated) that are input to and output from the data storage unit 1001. The buffer memory 1003 may store data (not illustrated) that is applied by the memory controller 1002 in response to a control signal from the memory controller 1002. The buffer memory 1003 may include the semiconductor device 1 described with reference to FIG. 1, the semiconductor device 3 described with reference to FIG. 6, and the semiconductor device 4 described with reference to FIG. 9. The buffer memory 1003 may read data that has been stored in the buffer memory 1003, and may output the read data to the memory controller 1002. The buffer memory 1003 may include volatile memory, such as dynamic random access memory (DRAM), mobile DRAM, and static random access memory (SRAM).

The I/O interface 1004 may provide a physical connection between the memory controller 1002 and an external device (or a host) so that the memory controller 1002 may receive a control signal for the input and output of data to and from the external device and may exchange data with the external device. The I/O interface 1004 may include one of various interface protocols, such as a USB, an MMC, PCI-E, an SAS, SATA, PATA, an SCSI, an ESDI, and IDE.

The electronic system 1000 may be used as an auxiliary memory device or external storage device of a host device. The electronic system 1000 may include a solid state disk (SSD), universal serial bus (USB) memory, a secure digital (SD) card, a mini secure digital (mSD) card, a micro SD card, a secure digital high capacity (SDHC) card, a memory stick card, a smart media (SM) card, a multi-media card (MMC), an embedded MMC (eMMC), and a compact flash (CF) card.

Figure 14:
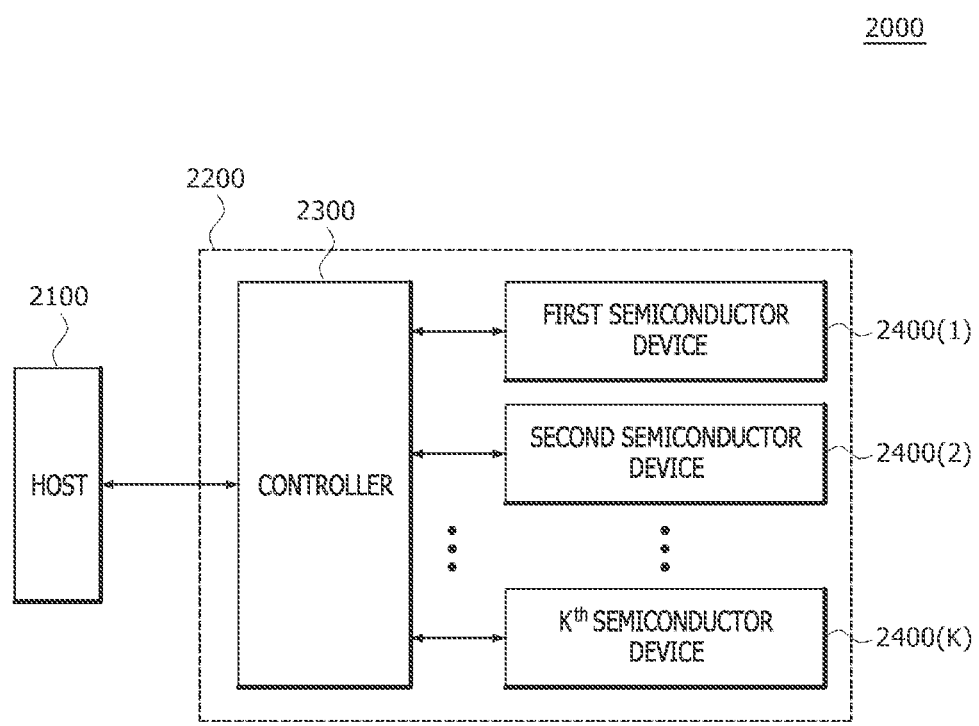
FIG. 14 is a block diagram illustrating a construction of an electronic system according to another embodiment of the present disclosure.

FIG. 14 is a block diagram illustrating a construction according to an embodiment of an electronic system 2000 according to another embodiment of the present disclosure. As illustrated in FIG. 14, the electronic system 2000 may include a host 2100 and a semiconductor system 2200.

The host 2100 and the semiconductor system 2200 may mutually transmit signals by using an interface protocol. The interface protocol that is used between the host 2100 and the semiconductor system 2200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB).

The semiconductor system 2200 may include a controller 2300 and semiconductor devices 2400 (1:K).

Each of the semiconductor devices 2400 (1:K) may include the semiconductor device 1, the semiconductor device 3 described with reference to FIG. 6, and the semiconductor device 4 described with reference to FIG. 9. Each of the semiconductor devices 2400 (1:K) may be implemented as one of dynamic random access memory (DRAM), phase change random access memory (PRAM), resistive random access memory (RRAM), magnetic random access memory (MRAM), and ferroelectric random access memory (FRAM).

The embodiments of the present disclosure have been described so far. A person having ordinary knowledge in the art to which the embodiments pertain will understand that the embodiments may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. A semiconductor device comprising:
    an even data input circuit configured to store, in an even core cell, data input through an even data pad and including a first pattern in response to an even data input strobe signal during a write operation of a parallel test; and
    an odd data input circuit configured to store, in an odd core cell, data input through the even data pad and including a second pattern in response to an odd data input strobe signal during the write operation of the parallel test; and
    a comparison code generation circuit configured to compare data output from the even core cell and data output from the odd core cell during a read operation of the parallel test and to output a comparison code used to detect a fail in the data output from the even core cell or the data output from the odd core cell.

2. The semiconductor device of claim 1, wherein the even data input circuit comprises an even driving circuit configured to drive the even driving data based on even alignment data when a logic level of the even data input strobe signal transitions to a different logic level.

3. The semiconductor device of claim 2, wherein the even driving circuit is configured to:
    buffer and latch the even alignment data when the logic level of the even data input strobe signal transitions to the different logic level;
    generate an even pull-up signal and an even pull-down signal based on the buffered even alignment data; and
    drive the even driving data in response to the even pull-up signal and the even pull-down signal.

4. The semiconductor device of claim 2, wherein the even data input circuit further comprises an even repeater configured to generate even write core data stored in the even core cell by repeating the even driving data in response to a write strobe signal.

5. The semiconductor device of claim 1, wherein the odd data input circuit comprises an odd driving circuit configured to drive odd driving data based on even alignment data when a logic level of the odd data input strobe signal transitions, during the parallel test, to a different logic level.

6. The semiconductor device of claim 5, wherein the odd driving circuit is configured to:
    buffer and latch the even alignment data when the logic level of the odd data input strobe signal transitions, during the parallel test, to the different logic level;
    generate an odd pull-up signal and an odd pull-down signal based on the buffered even alignment data; and
    drive the odd driving data in response to the odd pull-up signal and the odd pull-down signal.

7. The semiconductor device of claim 1, further comprising a data input strobe signal control circuit configured to generate the even data input strobe signal and the odd data input strobe signal, in response to a first test mode signal, a second test mode signal, and a data input strobe signal generated when the write operation of the parallel test is performed.

8. The semiconductor device of claim 7, wherein the data input strobe signal control circuit is configured to:
    fix a logic level of the even data input strobe signal when the first test mode signal is enabled; and
    generate the odd data input strobe signal in response to the data input strobe signal.

9. The semiconductor device of claim 7, wherein the data input strobe signal control circuit is configured to:
    fix a logic level of the odd data input strobe signal when the second test mode signal is enabled; and
    generate the even data input strobe signal in response to the data input strobe signal.

10. The semiconductor device of claim 1, further comprising:
an even repeater configured to generate even read driving data by repeating even read core data output by the even core cell in response to the read strobe signal when a read operation of the parallel test is performed;
an odd repeater configured to generate odd read driving data by repeating odd read core data output by the odd core cell in response to the read strobe signal; and
wherein the comparison code generation circuit is configured to generate the comparison code based on the even read driving data and the odd read driving data.

11. The semiconductor device of claim 1, wherein the comparison code generation circuit is configured to generate the comparison code by comparing the even read driving data and the odd read driving data when the parallel test is performed.

12. The semiconductor device of claim 1, further configured to output the comparison code on the even data pad.

13. The semiconductor device of claim 1, wherein the comparison code generation circuit comprises:
a selection signal generation circuit configured to generate a selection signal, based on a parallel test signal and the odd read driving data; and
a selection output circuit configured to output the even read driving data as the comparison code by buffering the even read driving data or to output the even read driving data as the comparison code by inverting and buffering the even read driving data in response to the selection signal.

14. The semiconductor device of claim 1, further comprising:
an even repeater configured to generate even read driving data by repeating even read core data output by the even core cell or odd buffer data, in response to a test mode signal and a read strobe signal, when a read operation of the parallel test is performed; and
an odd repeater configured to generate the odd buffer data by repeating odd read core data output by the odd core cell in response to the read strobe signal.

15. The semiconductor device of claim 14, wherein the even repeater is configured to receive the test mode signal having a second logic level for a second repetition interval entered after a first repetition interval is terminated, after a level of the test mode signal is a first logic level for the first repetition interval entered when the read operation of the parallel test is performed.

16. The semiconductor device of claim 14, wherein the even repeater is configured to:
generate even buffer data by buffering the even read core data when a logic level of the read strobe signal transitions to a different logic level; and
drive the even read driving data based on the even buffer data or the odd buffer data in response to the test mode signal.

17. The semiconductor device of claim 14, wherein the odd repeater is configured to:
generate the odd buffer data by buffering the odd read core data when a logic level of the read strobe signal transitions to a different logic level; and
drive odd read driving data based on the odd buffer data.

18. The semiconductor device of claim 1, further configured to output the even read driving data on the even data pad.

19. A semiconductor device comprising:
an even data input circuit configured to store, in an even core cell, data input through an even data pad and including a first pattern in response to an even data input strobe signal during a write operation of a parallel test;
an odd data input circuit configured to store, in an odd core cell, data input through an even data pad and including a second pattern in response to an odd data input strobe signal during the write operation of the parallel test; and
a comparison code generation circuit configured to generate, when a read operation of the parallel test is performed, a comparison code by comparing even read driving data generated by repeating even read core data output by the even core cell in response to a read strobe signal and odd read driving data generated by repeating odd read core data that is output by the odd core cell in response to the read strobe signal; and
wherein the comparison code is used to detect a fail in the data output by the even core cell or the data output by the odd core cell.

20. A semiconductor device comprising:
an even data input circuit configured to store, in an even core cell, data input through an even data pad and including a first pattern in response to an even data input strobe signal during a write operation of a parallel test;
an odd data input circuit configured to store, in an odd core cell, data input through an even data pad and including a second pattern in response to an odd data input strobe signal during the write operation of the parallel test; and
an even repeater configured to generate, when a read operation of the parallel test is performed, even read driving data by repeating even read core data output by the even core cell or odd buffer data in response to a test mode signal and a read strobe signal; and
a comparison code generation circuit configured to compare data output from the even core cell and data output from the odd core cell during a read operation of the parallel test and to output a comparison code used to detect a fail in the data output from the even core cell or the data output from the odd core cell.

* * * * *